United States Patent [19]

Howard, Jr.

[11] 3,881,179

[45] Apr. 29, 1975

[54] ZENER DIODE STRUCTURE HAVING THREE TERMINALS

[75] Inventor: William G. Howard, Jr., Mesa, Ariz.

[73] Assignee: Motorola, Inc., Franklin Park, Ill.

[22] Filed: Aug. 23, 1972

[21] Appl. No.: 283,131

[52] U.S. Cl. .......... 357/13; 357/21; 357/40; 357/48; 357/89; 307/318

[51] Int. Cl. .......... H01l 9/00

[58] Field of Search..... 317/235 T, 235 AM, 234 Q, 317/235 A, 235 Y, 235 Z, 235 D; 357/13, 14, 20, 21, 22, 35, 36, 40, 48, 89; 307/318

[56] References Cited

UNITED STATES PATENTS

| | | | |
|---|---|---|---|
| 3,304,470 | 2/1967 | Hayashi et al. | 317/235 |
| 3,312,882 | 4/1967 | Pollock | 317/235 |
| 3,341,380 | 9/1967 | Mets et al. | 148/187 |
| 3,396,317 | 8/1968 | Vendelin | 317/234 |
| 3,402,325 | 9/1968 | Minks | 317/16 |
| 3,484,308 | 12/1969 | Lesk | 148/33.5 |
| 3,502,951 | 3/1970 | Hunts | 317/235 |
| 3,517,280 | 6/1970 | Rosier | 317/235 |
| 3,542,551 | 11/1970 | Rice | 96/36.2 |
| 3,544,397 | 12/1970 | Weinerth | 148/177 |
| 3,549,961 | 12/1970 | Gault | 317/235 |
| 3,555,374 | 1/1970 | Usuda | 317/235 |
| 3,567,965 | 3/1971 | Weinerth et al. | 307/318 |
| 3,567,965 | 3/1971 | Weinerth et al. | 307/303 |
| 3,581,164 | 5/1971 | Pfander et al. | 317/234 |
| 3,584,266 | 6/1971 | Schilling | 317/234 |
| 3,614,468 | 10/1971 | Ehlbeck | 307/215 |
| 3,663,872 | 5/1972 | Yanagawa | 317/235 R |
| 3,699,406 | 10/1972 | Mapother et al. | 317/235 R |
| 3,748,545 | 7/1973 | Beale | 317/235 R |

OTHER PUBLICATIONS

M. Cowan et al., "Compatible Lateral PNP and Doubled–Diffused NPN Device," I.B.M. Tech. Discl. Bull., Vol. 13 No. 4, Sept. 1970, p. 939–940.

F. TSUI, "Making High–B and Low–B Transistors on the Same Chip," I.B.M. Tech. Discl. Bull., Vol. 15 No. 1, June 1972, p. 232.

*Primary Examiner*—Andrew J. James
*Assistant Examiner*—Joseph E. Clawson, Jr.
*Attorney, Agent, or Firm*—Vincent J. Rauner; Maurice J. Jones, Jr.

[57] ABSTRACT

The zener diode structure is fabricated by standard monolithic processes and provides a constant reference voltage for driving a high impedance load. The diode includes an anode element provided by P-type diffusion into an epitaxial layer. Electrical connections between the anode and the surface terminals of the device are provided by "base" diffusion. A cathode element is formed by an "emitter" diffusion which extends from the surface of the epitaxial layer, into the base diffusion, and borders the anode to form an anode-to-cathode junction. Since the base diffusion has a higher resistivity than the anode-to-cathode junction, buried breakdown occurs at the anode-to-cathode junction. The drive current for the zener is conducted by a path between a first anode terminal, which is connected to the base diffusion, and the cathode terminal. The constant reference voltage is developed between a second anode terminal, which is also connected to the base diffusion, and the cathode terminal.

13 Claims, 5 Drawing Figures

ZENER DIODE STRUCTURE HAVING THREE TERMINALS

RELATED APPLICATION

The subject matter of this application is related to the subject matter of an application entitled "Integrated Circuit Junction Capacitor Having Emitter Diffusion Extending Across Isolation Diffusion," of Fred Adamic, Jr., et al., Ser. No. 216,680, filed Jan. 10, 1972, and assigned to the same assignee as the subject application, now abandoned.

BACKGROUND OF THE INVENTION

Zener diodes provide, among other useful functions, constant reference voltages having a wide spectrum of amplitudes. The zener diode is unique because its electrical properties are derived from a semiconductor PN junction which operates in the reverse breakdown region. Many different types of electrical operations are demanded of monolithic integrated circuit structures and to facilitate performance of some of these functions zener diodes are useful. More particularly, monolithic digital-to-analog converters or monolithic analog-to-digital converters require zener diodes which provide an extremely constant reference voltage to a high impedance load. It is desirable that these zeners be manufacturable by standard monolithic processes, so that they can be created in the same structure and at the same time as the other components of such converters.

Reliable, discrete prior art zener diodes employ buried breakdown to provide stable reference voltages. These zeners have semiconductor structures which generally require direct electrical connection to be made to each of the top and bottom surfaces of the diode. Hence, such discrete zener diodes are not readily manufacturable in monolithic integrated circuit form because monolithic structures generally enable connections to be made only to one surface of the components thereof. Moreover, the processing steps employed in the manufacture of discrete zener diodes are usually substantially different from the processing steps used to form monolithic integrated circuits.

Some prior art techniques for producing zener diodes in monolithic integrated circuits solve the above mentioned connecting problem by providing structures wherein both the anode and cathode portions of the zener extend to the surface of the integrated circuit. This allows surface connection to the anode and cathode elements. However, during operation of this zener extremely high field strengths result across the exposed junction which causes contaminants at or near the surface to be ionized and swept into the junction area. The resulting contaminated junction is more likely to perform radically than the junction of a discrete zener diode that provides breakdown beneath the surface. Hence, the magnitudes of the breakdown voltages of prior art integrated circuit zener diodes change as much as 200 millivolts over as litle time as a week of operation.

On the other hand, if a buried breakdown zener structure were to be employed in a monolithic integrated circuit, a conducting path of semiconductor material would probably have to be formed between the element of the diode located farthest from the surface and the surface of the integrated circuit. The resistance of this path produces a voltage in series with the zener voltage that tends to undesirably change with changes in the amplitude of the zener drive current and thus causes an unwanted variation in the output voltage.

Hence, neither of the above structures result in a satisfactory zener diode for integration into monolithic structures requiring very stable direct current reference voltages. Because of the unsatisfactory nature of prior art monolithic zener diodes, discrete zener diodes are often employed which must be located external to the integrated circuit housing. This results in increased cost of manufacture and an objectionable increase in the size of some products.

SUMMARY OF THE INVENTION

One object of this invention is to provide an improved zener diode structure.

Another object of this invention is to provide an improved monolithic zener diode structure which is suitable for being manufactured by standard monolithic integrated circuit processing steps and in which voltage breakdown occurs beneath the surface of the integrated circuit.

Still another object of this invention is to provide a monolithic integrated circuit zener diode which develops a substantially constant reference voltage between terminals on the surface thereof and which is suitable for driving a high impedance load even though the amplitude of the drive current for the zener diode fluctuates.

A zener diode of the invention may be fabricated by growing an epitaxial layer of a first conductivity type which extends from and covers a substrate of a second conductivity type. Next, a diffusion is utilized to convert a first portion of the epitaxial layer, which extends from the surface thereof toward the substrate, into a material of the second conductivity type to provide either the anode or cathode element of the zener. A "base" diffusion is then employed to convert a portion extending between the surface of the epitaxial layer and the first portion or element to a material also of the second conductivity type which forms conductive paths between the surface and the element of the diode. This base diffused region has a greater cross-sectional area and a lower impurity concentration level than the first portion. Next, an "emitter" diffusion converts material extending through and surrounded by the base diffused portion to the first conductivity type to form a junction with the first portion and to provide the other of the cathode and anode elements of the zener diode. An electric field is developed across the junction between the elements of the zener in response to a current flowing between a drive terminal connected to the base diffused region and a terminal connected to the emitter diffused region. As the strength of the electric field increases, a value is reached whereat buried breakdown occurs at this junction. The resulting reference voltage is provided between a sense terminal which also is connected to the base diffused region, and the terminal connected to the emitter diffused region. Thus, the resulting zener diode is suitable for being manufactured by standard monolithic processes andprovides a stable reference voltage for driving high impedance loads.

DETAILED DESCRIPTION

Figure 1:
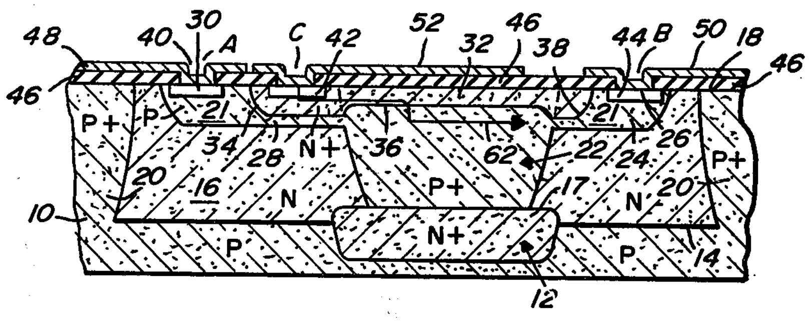
FIG. 1 shows an enlarged cross-sectional view of one zener diode structure of the invention.
Figure 2:
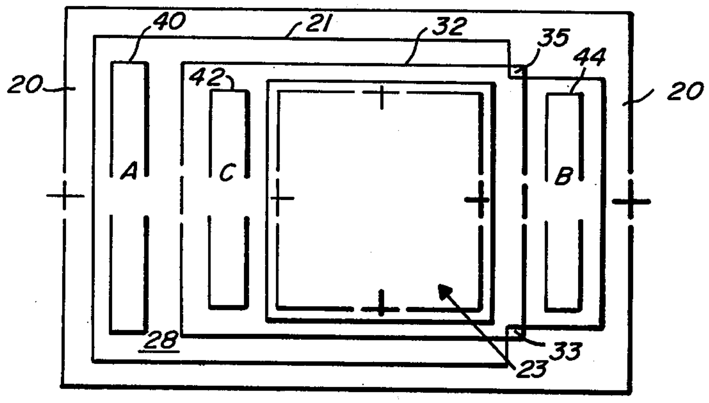
FIG. 2 shows an enlarged top view which indicates the shapes and relationships of the outlines of the diffusions and pre-ohmic openings used to form the zener diode of FIG. 1.

Referring now to the drawing, in FIG. 1 there is shown an enlarged cross-sectional view of one zener diode of the invention which has an overall thickness on the order of 250 microns. FIG. 2 shows an enlarged top view of the zener diode of FIG. 1 which has a length of the order of 10 mils and a width of the order of 6 mils. The zener diode structure shown in FIGS. 1 and 2 generally could be integral with other components of a monolithic structure, although there are other applications in which it might be employed in a discrete form.

In FIG. 1 there is shown an enlarged substrate portion 10, which may be a P-type silicon, on which the zener diode is formed. Substrate 10, which may have a thickness on the order of 240 microns, is not drawn to scale with respect to the rest of the zener. A plurality of other components, which are interconnected to form the integrated circuit, may be formed on other substrate portions which are integral with portion 10. These other substrate portions are not shown for simplicity.

Buried layer 12 is formed in substrate portion 10, at the same time that other buried layers may similarly be provided elsewhere in the substrate, by first growing a layer of silicon dioxide over surface 14 of substrate portion 10 and then providing an aperture or window in the oxide of a desired shape by known photolithographic and etching processes. The aperture may have approximately the shape of square 13, indicated in FIG. 2. Next, a suitable donor impurity, such as arsenic, is diffused through the portion of surface 14 exposed by the aperture to convert a selected portion of the P-type substrate into an N+ buried layer 12.

After the silicon dioxide mask is removed, an epitaxial layer 16 of single crystal silicon is grown, by known techniques, on the surface provided by substrate 10 and buried layer 12. The epitaxial layer may be of the same conductivity type, i.e., N, as the buried layer and, the epitaxial layer may have a lesser concentration of donor impurities than the buried layer. Immediately after the buried layer 12 was initially formed its top surface 17 was in the same plane as surface 14 of the substrate. However, during subsequent processing steps surface 17 of the buried layer tends to out-diffuse into epitaxial layer 16 to provide the raised configuration shown in FIG. 1.

Next, a layer of silicon dioxide is grown on the top surface 18 of epitaxial layer 16. Again known photolithographic and etch processes are used to provide openings therein of selected shape to develop a diffusion mask for an isolation diffusion. Selected portions 20 and 22 of epitaxial layer 16 are converted into a P+ conductivity type material by the deep diffusion of an acceptor impurity, such as boron, through the exposed areas of the top surface 18 of epitaxial layer 16. The resulting surface concentration of the isolation diffusion is about $5 \times 10^{18}$ acceptors/cm$^3$.

Portion 20 forms a standard isolation area, which outlines and surrounds the zener diode, as shown in FIG. 2. The other components (not shown) of the integrated circuit are similarly surrounded by the isolation diffusion. Portion 20 along with substrate 10, which form an anode, cooperates with epitaxial layer 16, which forms the cathode, to provide an isolating diode structure that provides a high impedance between the zener structure and adjacent transistor, capacitor, resistor or other diode structures when the isolating diode structure is reverse biased. To provide the necessary reverse bias to the isolating diode during operation of the circuit, the substrate and the standard isolation areas are connected to a potential which biases them negative with respect to epitaxial layer 16 in accordance with known practice.

Standard isolation portion 20 terminates at the top surface 14 of substrate 10. On the other hand, non-standard isolation diffused region 22, which forms the anode of the zener diode, terminates on top surface 17 of buried layer 12, so that anode 22 is insulated from the aforementioned bias applied to substrate 10. The general outline of anode 22 is indicated by square 23 of FIG. 2.

After the isolation diffusion, another silicon dioxide mask is formed on the upper surface 18 of epitaxial layer 16 and patterned to provide selected apertures through which a "base" diffusion takes place. This diffusion is so named because it is also utilized to form the base areas in integrated circuit transistors. However, in the manufacture of the zener diode structure of the invention, this base diffusion is utilized to form an electrically conductive portion 21 of FIG. 1 which includes a conductive path 24 between anode 22 of the zener diode and area 26 on top surface 18 of the epitaxial layer, and another conductive path 28 between anode 22 and area 30 of top surface 18. Conductive portion 21 is formed by subjecting a selected top area of epitaxial layer 16 to the diffusion of an acceptor type impurity. Either the concentration or time of exposure to the acceptor impurity may be regulated such that the resulting P-type concentration of portion 21 is less than the P-type concentration in anode 22 to facilitate buried breakdown, as will be subsequently explained in greater detail. The surface concentration of conductive portion 21 is on the order of $5 \times 10^7$ acceptors/cm$^3$. Conductive portion 21 does not extend as deep into epitaxial layer 16 as isolation diffusions 20 and 22, also it has a greater cross-sectional area than anode 22. In the area where conductive portion 21 and anode 22 coincide, the total acceptor concentration is equal to the sum of the two concentrations.

After the base diffusion, a further mask is provided on surface 18 of the epitaxial layer which is patterned to provide apertures through which an "emitter" diffusion is made into conductive portion 21. Again, the "emitter" diffusion is so named because it is also used to simultaneously provide the emitter elements of the integrated circuit transistors located elsewhere in the monolithic structure. However, the emitter diffusion provides a cathode 32 of the N+ conductivity type for the subject zener diode. As shown in FIG. 1, cathode element 32 has a first boundary portion 34 which abuts path 28, a second boundary portion 36 which abuts anode 22, and a third boundary portion 38 which abuts path 24. Cathode 32 overlaps the junction between conductive portion 21 and epitaxial region 16 at corners 33 and 35 as shown in FIG. 2, thereby increasing the electrical isolation between paths 24 and 28. Boundary portion 36 is the junction of the zener diode. Cathode 32 extends farther into the conductive portion 21 where the conductive portion does not coincide with anode 22 because the concentration of acceptor impurities is less in the non-coinciding portions than in the coinciding portions. This phenomena results in the raised configuration of the top surface of anode 22 as compared to the top surface of the adjacent portions of conductive portion 21, shown in FIG. 1.

After cathode 32 of the zener has been diffused, a final layer of silicon dioxide 46 is applied to surface 18. In order to permit connection to other circuit components, a set of pre-ohmic openings 40, 42 and 44 is etched in silicon dioxide layer 46 at selected points over the zener, as shown in FIGS. 1 and 2. A thin, even coating of aluminum or other conductive material is then vacuum deposited over the entire surface of the wafer.

The interconnection pattern between the components of the monolithic circuit is formed on the conductive material by photo-resist techniques. The undesired areas are then etched away leaving a pattern of aluminum interconnections between the terminals of the subject zener diode and other components and terminals. More particularly, metalization pattern 48 or terminal A makes an ohmic connection to anode path 28 at area 30 and metalization pattern 50 or terminal B makes an ohmic connection to anode path 24 at area 26. Moreover, metalization patern 52 or terminal C makes connection to cathode 32 through opening 42. Conductive portion 21 and cathode 32 have greater cross-sectional areas than the anode to allow terminals A, B and C to be located at points remote from the shallowest portions of cathode 32, to avoid "spike-through" or shorting problems which might otherwise be caused by the aluminum extending through junction 36. Thus, metalization 48 forms an ohmic contact to conductive portion 21 near boundary portion 34, which is located between path 28 and cathode 32. Similarly, metalization 52 forms an ohmic contact to cathode 32 at an area which is also located near boundary portion 34. On the other hand, metalization 50 forms an ohmic contact to conductive portion 21 near boundary portion 38 which is located on the opposite side of cathode 32 from boundary portion 34.

Figure 3:
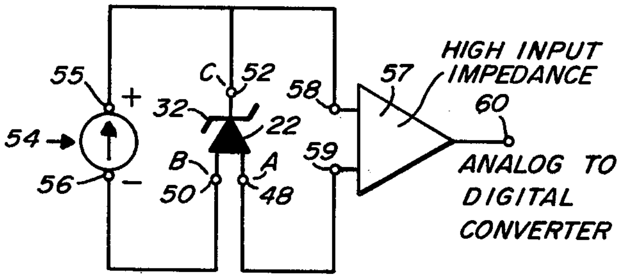
FIG. 3 is a partial block and schematic diagram illustrating one circuit connection of the three terminal zener diode illustrated in FIGS. 1 and 2.

FIG. 3 shows a circuit including the zener diode of FIG. 1. Current source 54 has a positive output terminal 55 connected to cathode terminal C and a negative output terminal 56 connected to anode drive terminal B. High impedance load 57, which may be an operational amplifier, has one input terminal 58 connected to cathode terminal C and another input terminal 59 connected to anode sense terminal A. The output terminal 60 of load 57 may be connected to the remainder of the circuitry of an analog-to-digital converter, in a known manner.

Figure 4:
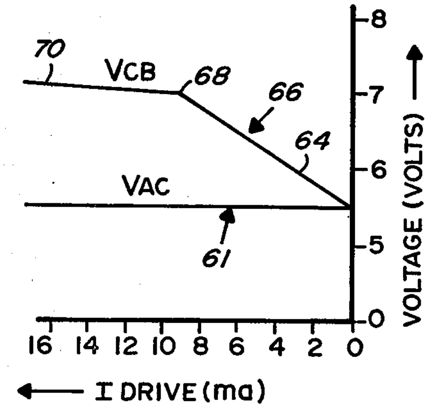
FIG. 4 is a graph of the voltages between the drive terminals and between the sense terminals of the zener diode of FIG. 1 as a function of the driving current.

In operation, a direct current driving current having an amplitude which is subject ot variation is applied by source 54 between zener terminals B and C so that P+anode structure 22 is biased negative with respect to the N+ cathode structure 32. This voltage results in a reverse bias being developed across the boundary designated by line segments 34, 36 and 38 of FIG. 1. As previously pointed out, connecting paths 24 and 28 have lower impurity concentrations and hence, high resistivities than the portion of anode 22 adjacent junction 36. Therefore, a wider depletion region results in paths 24 and 28 than in anode 22. As a result, the field concentration is much higher across boundary portion 36 than across the boundary indicated by line segments 34 and 38. Therefore, as the magnitude of the drive current rises, zener breakdown occurs first across boundary 36. This buried breakdown insures that a breakdown voltage is developed by junction 36 which has a constant value, as indicated by graph 61 of FIG. 4.

Once breakdown has occurred, current flows along a path such as indicated by line 62 of FIG. 1. The voltage between terminals B and C, because of the resistance of the path therebetween, tends to vary as the magnitude of the driving voltage or current varies, as shown by portion 64 of graph 66 of FIG. 4. As the amplitude of the drive current provided by supply 54 is further increased, eventually breakdown also occurs between paths 24 and 28 and cathode 32, as illustrated by point 68 of curve 66 of FIG. 4. After this latter breakdown, the voltage between zener terminals C and B tends to be somewhat more constant as indicated by a portion 70 of curve 66. The magnitude of the breakdown voltage across boundaries 34 and 38, however, tends to be less stable than the breakdown across boundary 36 because of the exposed edges of these junctions. Extremely high field strengths across the exposed edges of boundaries 34 and 38 tend to cause contaminants near and on surface 18 to be ionized and swept into the junction areas. Hence, these contaminated junctions are more likely to perform erratically. The silicon dioxide layer 46 over the exposed edges of these junctions tends to reduce this effect. But because the exposed junctions are subjected to field strengths on the order of 200,000 volts per centimeter, it is nearly impossible to make an oxide thick and clean enough for continuous operation in such fields without some ionization occurring in the oxide and subsequent contamination of the junction in a manner similar to the contamination occurring in non-passivated diffused diodes. Since the breakdown voltages across boundary portions 34 and 38 are not sensed, the fact that the voltage associated therewith may not remain constant does not reduce the effectiveness of the zener diode structure of the invention.

The breakdown of junction 36 is extremely stable and can be sensed through path 28. The high impedance load 57 of FIG. 3 draws only a small amount of current through path 28, so that the extremely stable breakdown voltage occurring across junction 36 is not deteriorated by the resistance inherent in path 28. Thus, the zener diode structure of FIG. 1 develops a substantially constant reference voltage suitable for driving a high impedance load even though the amplitude of the drive voltage or current for the zener diode fluctuates.

Figure 5:
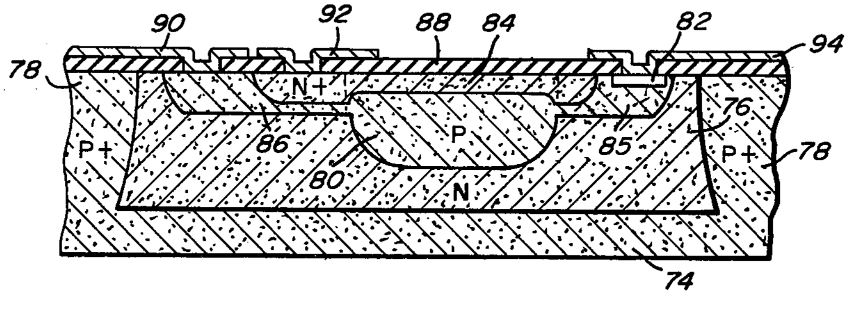
FIG. 5 shows an enlarged cross-sectional view of another zener diode structure of the invention.

FIG. 5 discloses another structure for the zener diode of the invention which does not include a buried layer and wherein the anode element is formed by two base diffusions rather than an isolation diffusion and a base diffusion. More specifically, FIG. 5 shows a P-type substrate portion 74 on which an N-type epitaxial layer 76 is grown. Next, standard P+ isolation diffusion 78 is performed in the previously described manner. A first P "base" diffusion 80 next provides anode element 80 having an acceptor impurity concentration of a given level. Since anode 80 does not extend to substrate 74, an isolating structure such as buried layer 12 of FIG. 1 is not required. A second P base diffused region 82 which has a higher resistivity, a greater cross-sectional area and less depth than the first base diffusion is provided into the first base diffusion. An N+ emitter diffused region 84 which may have less depth than second base diffused region 82 and a greater cross-sectional area than anode 80 is created in second base diffusion 82 to provide cathode 84 of the zener diode 80. Hence, second base diffusion 82 provides first and second paths 85 and 86 between anode 84 and the top surface of epitaxial layer 76. Again, the second base and emitter diffusions may overlap as indicated in FIG. 2 by corners 33 and 35. Since the impurity concentration of the first and second base diffusion are additive at the junction formed between anode 80 and cathode 84 buried breakdown is again achieved.

Finally, silicon dioxide layer 88 is applied and preohmic openings are provided therein through which patterned metalization conductors 90, 92 and 94 make contact to the elements of the diode, in a manner similar to that described with respect to the diode of FIG. 1. The diode shown in FIG. 5 performs in a manner similar to the diode of FIG. 1 and therefore, could also be employed in the circuit of FIG. 3.

Although the diode structures of FIGS. 1 and 5 have been described as having regions of specific conductivity types, it is apparent that all of the conductivity types and polarities of the operating voltage could be reversed thereby causing the anode and cathode elements of the zener diodes to be interchanged. These structures, resulting from the reversal of the impurity types, also form a zener diode structure falling within the scope of the present invention.

The described improved zener diode structure is suitable for being manufactured by standard monolithic integrated circuit processing steps along with the other components of a monolithic integrated circuit. The resulting zener diode structure is driven between first and second terminals thereof to develop a very stable reference voltage between the second terminal and a third terminal thereof which is suitable for driving a high impedance load or amplifier. Accordingly, the monolithic zener diode structure of the invention can be employed in integrated circuits such as either an analog-to-digital converter or a digital-to-analog converter. Other applications of this diode structure will be obvious to those skilled in the art.

I claim:

1. A zener diode fabricated in a monolithic integrated circuit structure and including in combination:

a semiconductor substrate of a first conductivity type;

a buried layer of a second conductivity type located in said semiconductor substrate;

a layer of semiconductor material partly of said second conductivity type which covers and extends from said substrate and said buried layer, said layer of semiconductor material having an outwardly facing surface;

a first portion of said layer of semiconductor material extending to said buried layer and being said first conductivity type of a given concentration;

a second portion of said layer of semiconductor material extending from said surface of said layer of semiconductor material toward said substrate and surrounding said first portion, said second portion being said first conductivity type and having a concentration which is less than said given concentration, said second portion making conductive contact between said first portion and said outwardly facing surface;

a third portion of said layer of semiconductor material extending from said surface and into said first portion to form a junction with said first portion, said third portion isolating said first portion from said outwardly facing surface of said layer of semiconductor material, said third portion being substantially surrounded by said second portion and of said second conductivity type, said third portion forming one of the anode and cathode elements of the zener diode, said first portion forming the other of said anode and said cathode elements of the zener diode;

first conductive means located over said outwardly facing planar surface, said first conductive means having a contact making ohmic connection only to one region of said second portion;

second conductive means located over said outwardly facing planar surface, said second conductive means having a contact making ohmic connection only to another region of said second portion; and third conductive means located over said outwardly facing planar surface, said third conductive means having a contact making ohmic connection only to said third portion.

2. The zener diode of claim 1 wherein said portions of said first conductivity type are P-type materials and said portions of said second conductivity type are N-type materials.

3. The zener diode of claim 1 wherein said first portion forms the anode and said third portion forms the cathode thereof.

4. The zener diode of claim 1 further including a fourth portion of said layer of semiconductor material extending from said surface of said layer of semiconductor material to said substrate, said fourth portion being of said first conductivity type and of said given concentration.

5. The zener diode of claim 1 wherein:

said contact of said first conductive means is located closer to said contact of said third conductive means than is said contact of said second conductive means;

said second conductive means and said third conductive means cooperating with said second semiconductor portion to facilitate energization of said junction located between said first semiconductor portion and said third semiconductor portion; and said first conductive means and said third conductive means cooperating with said second semiconductor portion to facilitate sensing of the voltage developed across said junction located between said first semiconductor portion and said third semiconductor portion.

6. A reference voltage supply circuit for providing a reference voltage of a constant magnitude between the terminals of a high impedance load, the reference voltage supply circuit including in combination:

power supply means providing an output current between first and second output terminals thereof, said output current having an amplitude which tends to fluctuate;

zener diode means formed in a layer of single crystal semiconductor material having a first portion with a first conductivity type of a given concentration, and a second portion extending from the surface of said single crystal material to said first portion having a second conductivity type, said first and second portions forming a junction beneath said surface of said single crystal material, and a third portion extending from said surface of said single crystal material and making conductive contact with said first portion, said third portion having a concentration of said first conductivity type which is less than said given concentration so that breakdown occurs across said junction;

first means forming an ohmic contact to said third portion near a first boundary of said second portion;

second means forming an ohmic contact to said second portion near said first boundary thereof;

third means forming another ohmic contact to said third portion at another boundary of said second portion, said second and said third means being connected to said output terminals of said power supply means so that a breakdown voltage is developed across said junction; and said first and said second means being connected to said terminals of said high impedance load so that the reference voltage developed by said junction breakdown is applied to said terminals of said high impedance load.

7. The reference voltage supply circuit of claim 6 wherein said zener diode means, said first means, said second means and said third means are all included in a monolithic integrated circuit.

8. A zener diode having anode and cathode regions for use in a structure wherein electrical connections are made only through an outwardly facing planar surface and for providing a stable reference voltage, such zener diode including in combination:

a layer of semiconductor material partly of a particular conductivity type havng the outwardly facing planar surface;

a first semiconductor material of the other conductivity type located in said layer of semiconductor material, said first semiconductor material having a deep portion and a shallow portion which are integral with each other, said deep portion forming one of the anode and cathode regions and extending a first distance from the outwardly facing planar surface into said layer of semiconductor material, said shallow portion forming a conductive path between said deep portion and the outwardly facing planar surface and extending a second distance from the outwardly facing planar surface into said layer of semiconductor material, said second distance being less than said first distance, said shallow portion having a lower impurity concentration than said deep portion;

a second semiconductor material of said particular conductivity type extending between the outwardly facing planar surface and said deep portion and forming the other of the anode and cathode regions, said second semiconductor material and said deep portion of said first material cooperating to form a junction which is isolated from the outwardly facing planar surface;

first conductive means having a first portion located on the outwardly facing planar surface and said first portion making electrical connection only to one region of said shallow portion;

second conductive means having a second portion located on the outwardly facing planar surface and said second portion only making electrical connection to another region of said shallow portion;

third conductive means having a third portion located on the outwardly facing planar surface and said third portion making electrical connection only to said second semiconductor material, said first and third conductive means facilitating energization of said junction; and said second and third conductive means facilitating sensing of the voltage developed across said junction.

9. The zener diode of claim 8 wherein:

said second semiconductor material is substantially enclosed by only said shallow portion of said first semiconductor material, the outwardly facing planar surface, and said deep portion; and said second semiconductor material being arranged to isolate said deep portion from the outwardly facing planar surface.

10. The zener diode of claim 7 wherein:

said layer of semiconductor material and said second semiconductor material are of the N conductivity type;

said deep portion of said first semiconductor material is of a P conductivity type of a given concentration; and said shallow portion is of a P conductivity type of a concentration which is less than said given concentration so that voltage breakdown first occurs between said deep portion of said material and said second material in response to a current applied through said second semiconductor material and said shallow portion.

11. The zener diode of claim 8 further including a semiconductor substrate of said other conductivity type forming a foundation for said layer of semiconductor material.

12. The zener diode of claim 11 further including:

a buried layer of said particular conductivity type located in said semiconductor substrate and covered by said layer of semiconductor material; and said deep portion of said first material extending through said layer of semiconductor material to said buried layer, said buried layer electrically isolating said deep portion from said semiconductor substrate.

13. The zener diode of claim 8 wherein said first portion of said first conductive means is located closer to said third portion of said third conductive means than is said second portion of said second conductive means.

* * * * *